(12) United States Patent
de Cremoux

(10) Patent No.: US 10,340,791 B2
(45) Date of Patent: Jul. 2, 2019

(54) CHARGE PUMP

(71) Applicant: Dialog Semiconductor (UK) Limited, London (GB)

(72) Inventor: Guillaume de Cremoux, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/130,408

(22) Filed: Apr. 15, 2016

(65) Prior Publication Data

US 2016/0308435 A1    Oct. 20, 2016

(30) Foreign Application Priority Data

Apr. 17, 2015 (GB) .................................. 1506579.0

(51) Int. Cl.
*G05F 1/10* (2006.01)
*H02M 3/07* (2006.01)
*G11C 27/02* (2006.01)

(52) U.S. Cl.
CPC ............ *H02M 3/07* (2013.01); *G11C 27/026* (2013.01)

(58) Field of Classification Search
CPC ...... H04B 1/0003; H04B 1/0014; H04B 1/10; H04B 1/1036; H01L 27/088; H02M 3/07; H03F 1/0227; H03F 1/0277; H03F 3/195
See application file for complete search history.

(56) References Cited

U.S. PATENT DOCUMENTS

| 5,483,434 | A | 1/1996 | Seesink |
| 5,760,637 | A | 6/1998 | Wong et al. |
| 5,761,108 | A | 6/1998 | Martin |
| 5,940,283 | A | 8/1999 | Mihara et al. |
| 6,226,193 | B1 * | 5/2001 | Bayer ..................... H02M 3/07 363/59 |
| 6,625,725 | B1 * | 9/2003 | Wu ..................... G06F 9/30076 712/228 |
| 6,650,711 | B1 * | 11/2003 | Booth ..................... H03C 3/40 375/302 |
| 7,612,603 | B1 | 11/2009 | Petricek et al. |
| 8,872,556 | B1 | 10/2014 | Chen et al. |
| 2005/0030771 | A1 | 2/2005 | Conte et al. |

(Continued)

FOREIGN PATENT DOCUMENTS

| CN | 101098104 | 1/2008 |
| DE | 102009014509 | 10/2010 |

OTHER PUBLICATIONS

"Design of a Step-Down DC-DC Controller Integrated Circuit with Adaptive Dead-Time Control," by Zhipeng Li, Masters Thesis, Massachusetts Institute of Technology, Dept. of Electrical Engineering and Computer Science, May 21, 2010, pp. 1-77.

(Continued)

*Primary Examiner* — Sibin Chen

(74) *Attorney, Agent, or Firm* — Saile Ackerman LLC; Stephen B. Ackerman

(57) ABSTRACT

A method of operating a charge pump where successive values of a charge pump output voltage are measured and compared is presented. The result of the comparison is used to adjust one or more parameters of the charge pump operation A charge pump's maximum efficiency is tracked by storing and comparing successive output voltage values, with sample and hold circuitry.

11 Claims, 8 Drawing Sheets

(56) References Cited

U.S. PATENT DOCUMENTS

| | | | |
|---|---|---|---|
| 2005/0122751 A1 | 6/2005 | Zeng et al. | |
| 2005/0281058 A1 | 12/2005 | Batarseh et al. | |
| 2006/0197583 A1 | 9/2006 | Yen et al. | |
| 2008/0056030 A1* | 3/2008 | Cho | G11C 7/1051 365/194 |
| 2008/0231347 A1* | 9/2008 | Yen | H02M 3/07 327/536 |
| 2008/0231439 A1* | 9/2008 | Wu | G06F 11/325 340/540 |
| 2009/0072800 A1 | 3/2009 | Ramadass et al. | |
| 2009/0153254 A1* | 6/2009 | Yu | H03C 3/0925 331/16 |
| 2011/0279173 A1 | 11/2011 | Singnurkar | |
| 2012/0250753 A1* | 10/2012 | Zhong | H04L 25/03057 375/233 |

OTHER PUBLICATIONS

"Hybrid Energy Storage System based on Compressed Air and Super Capacitors with MEPT (Maximum Efficiency Point Tracking)," by Sylvain Lemofouet et al., The 2005 International Power Electronics Conference, IEEE Transactions on Industrial Electronics (Impact Factor: 6.5), Jul. 2006; 53(4):1105-1115. DOI: 10.1109/TIE.2006, pp. 461-468.

"The ins and outs of charge-pump converter ICs," designfeature by Mikhail Ioffe, Fishman Transducers Inc., Jun. 10, 1999, pp. 135-142, www.ednmag.com.

"Ultralow Power Boost Regulator with MPPT and Charge Management," Analog Devices, Data Sheet ADP5090, pp. 1-19, copyright 2014.

"Design and Performance Analysis of Supercapacitor Charging Circuits for Wireless Sensor Nodes," by Sehwan Kim et al., IEEE Journal on Emerging and Selected Topics in Circuits and Systems, vol. 1, Issue 2, Jun. 2011, pp. 1-7.

"Maximum Efficiency Point Tracking for Adjustable-Speed Small Hydro Power Plant," by A. Borghetti et al., 16th PSCC, Glasgow, Scotland, Jul. 14-18, 2008, pp. 1-7.

"A Capacitor Charge Pump DC-DC Converter for Physics Instrumentation," by Peter Denes et al., IEEE Transactions on Nuclear Science, vol. 56, Issue: 3, Jun. 2009, pp. 1507-1510.

"Fully Integrated High-Voltage Generator with Optimized Power Efficiency," by Doutreloigne Jan, Journal of Computer and Communications, pp. 1-8, Published Online Nov. 2014 in SciRes.: http://www.scirp.org/journal/jcc.

"A Wide Output Range, High Power Efficiency Reconfigurable Charge Pump in 0.18 μm BCD process," by Hyung-Gu Park et al., Journal of Semiconductor Technology and Science, vol. 14, No. 6, Dec. 2014, pp. 777-788.

EPA, Electronics Laboratories Advanced Engineering Course on Power Management, "Switched-Capacitor Power Supplies," Lausanne, Switzerland, Sep. 2-5, 2002, Jesper Steensbaard et al., pp. 1-22.

German Office Action, File Ref: 10 2016 206 194.1, Applicant: Dialog Semiconductor (UK) Limited, dated Feb. 27, 2019, 7 pages, and English language translation, 9 pages.

* cited by examiner

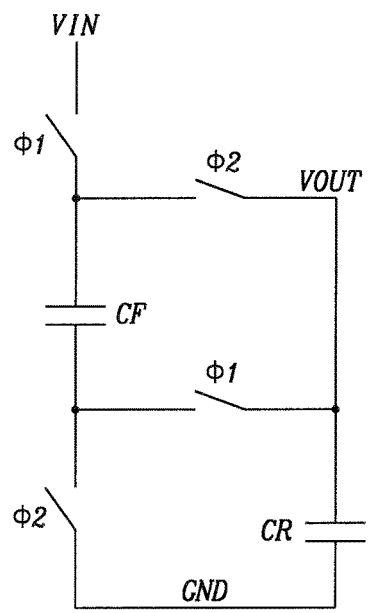
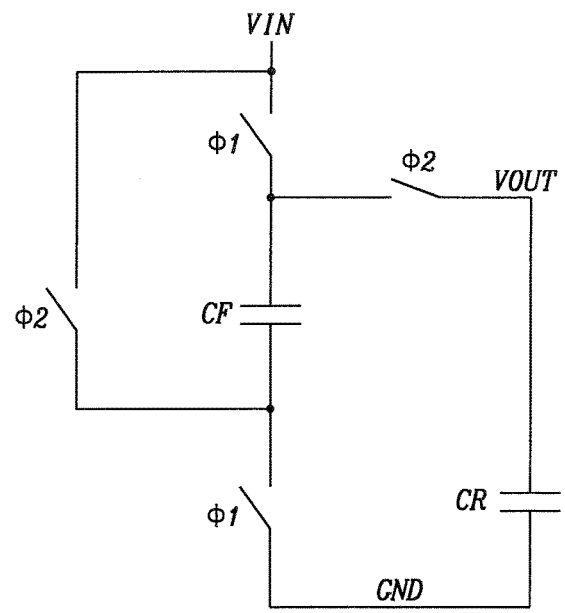
FIG. 1A          FIG. 1B
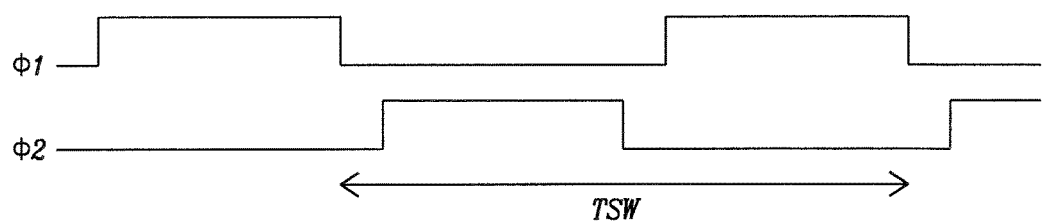
FIG. 2

CHARGE PUMP

TECHNICAL FIELD

The present disclosure relates to a charge pump, and in particular to a charge pump with an improved efficiency, and an associated method.

BACKGROUND

A charge pump is a DC-DC converter that receives an input voltage VIN and provides a different output voltage VOUT. The charge pump comprises one or more energy storage elements (usually capacitors) and switches that selectively apply voltages to the energy storage elements.

In the act of converting an input voltage to a lower or higher output voltage there are some energy losses. A charge pump has an efficiency that can be characterized by an equivalent resistance (RE). RE is known to vary for a given load depending on the switching frequency of the switches that are used to operate the charge pump, and on the passive components used for the charge-pump.

SUMMARY

There is a need for improved methods of optimizing charge pump switching frequency, or other charge pump parameters, in order to improve charge pump efficiency. According to a first aspect of the present disclosure there is provided a method of operating a charge pump wherein successive values of a charge pump output voltage are measured and compared, and the result of the comparison is used to adjust one or more parameter(s) of the charge pump operation.

Optionally, the parameter of the charge pump operation is a switching frequency of the charge pump.

Another example of a parameter that can be adjusted is the number of flying capacitors, meaning the value of CF can be adjusted. Switches can be provided to selectively connect a chosen number of flying capacitors.

The charge pump is of a type comprising a plurality of energy storage elements and switches arranged to selectively apply voltages to the energy storage elements in a charging phase and a discharging phase.

A switching frequency of a charge pump is the frequency at which the charge pump circuit alternates between a first configuration associated with a first phase and a second configuration associated with a second phase. The first and second phases may be charging and discharging phases, or vice versa.

Optionally, measuring and comparing successive values of charge pump output voltage comprises sampling and holding a first output voltage value; sampling and holding a second output voltage value; and comparing the held output voltage values.

Optionally, a parameter is adjusted in a first direction if the output voltage is determined to be increasing and a second direction if the output voltage is determined to be decreasing.

Adjusting a parameter in one direction or another generally means either increasing or decreasing the parameter.

According to a second aspect of the present disclosure there is provided a DC-DC voltage converter circuit comprising:

a charge pump;
a measurement circuit for measuring and storing successive values of an output voltage of the charge pump; and
a logic circuit for comparing the stored output voltage values and adjusting an operational parameter of the charge pump based on the comparison Optionally, the measurement circuit comprises a sample and hold circuit.

Alternatively, the measurement circuit comprises a shift register.

Optionally, the output of the logic circuit is used to tune the duration of a delay used fora charging or discharging phase of the charge pump.

Optionally, the logic circuit comprises a state machine.

A state machine is any kind of circuit that can be in one state at a time and can transition from one state to another by a triggering event or condition.

BRIEF DESCRIPTION OF THE DRAWINGS

The disclosure will now be described, by way of example only, with reference to the accompanying drawings, in which:

FIGS. 1A and 1B illustrate two examples of two-phase charge-pumps;

FIG. 2 illustrates a timing diagram for a two-phase charge pump;

DESCRIPTION

Meanings of abbreviated terms used in the following description can be found in the glossary that is found below.

The disclosure can be applied to any type of charge-pump. In FIGS. 1A and 1B, two examples of two-phase charge-pumps are shown. The energy storage elements comprise a flying capacitor CF and a reservoir capacitor CR selectively coupled between ground (GND) and either an input voltage VIN or output voltage VOUT by operation of switches. During a charging phase the switches marked φ1 are closed and the switches marked φ2 are open, and during a discharging phase the switches marked φ1 are open and the switches marked φ2 are closed. FIG. 2 is a timing diagram illustrating the operation of the switches φ1 and φ2.

More charge pump examples exist, with more than two phases, and with different arrangements of capacitors. However, the efficiency (EFF) can be generalized as the ratio of output to input power:

$$EFF = \frac{POUT}{PIN} = \frac{\frac{VIN}{2} - RE \cdot ILOAD}{VIN \cdot \frac{ILOAD}{2} + Pswitching + Pesr} \quad (1)$$

Where RE is reported by the literature:

$$RE = \frac{CR}{CF+CR} \cdot \frac{1}{4 \cdot CF \cdot FSW} + \frac{RDSON}{2} + \frac{Tdead}{CR} \quad (2)$$

When ILOAD is very high, Pswitching is negligible and Pesr is reported to be negligible enough. So the efficiency decreases linearly with the current. Conversely, it increases when FSW increases. Indeed, the faster the charge-pump switches, the higher the amount of charge injected to the output, thus the lower the equivalent output resistance RE.

Contrary to close-loop inductive converters, the efficiency of a CP at high load varies linearly with the decrease of VOUT.

However, the formula (2) is calculated by blindly superposing contributions. It proves to be true for extreme values only: when RDSON tends to 0, then RE is contributed by k/CF·FSW.

In reality, when either of the cycles ϕ1 or ϕ2 of the CP become shorter than the time constant (3·RDSON·CF) needed for the charge transfer, non-linear effects appear because the charge pump has no time to complete its discharge. If the frequency is increased beyond this inflexion 1/(6Π·RDSON·CF), then RE restarts increasing. So for a given load ILOAD, there is an optimum of switching frequency that minimizes RE. This is proven by simulations on an ideal setup, with the results plotted in FIG. 3. This shows efficiency (y-axis) versus switching frequency (x-axis), for different loads—1 A, 2 A, 5 A and 10 A.

Figure 3:
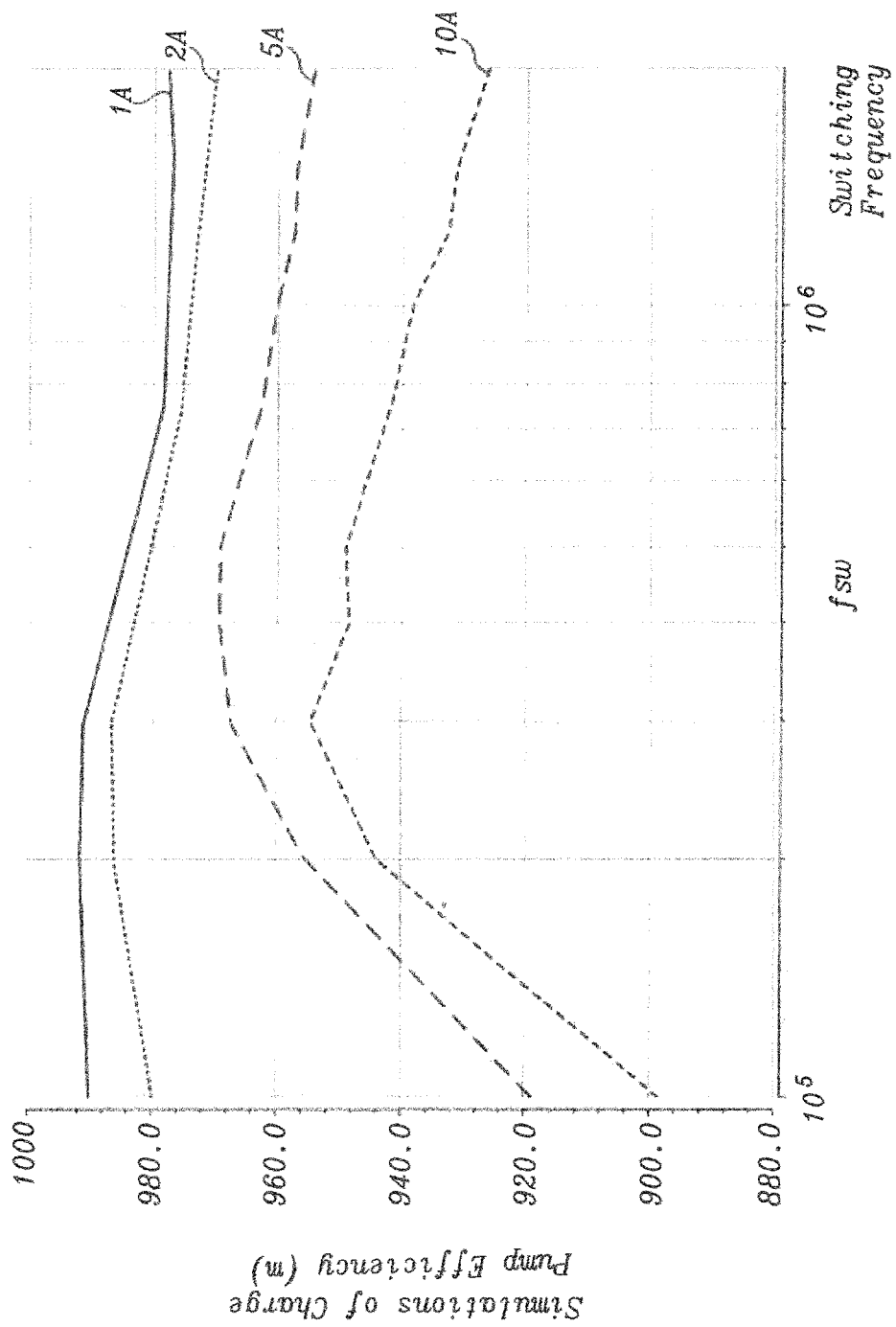
FIG. 3 illustrates simulations of charge pump efficiency versus switching frequency for different loads.

Again, this characteristic has nothing to do with the more familiar switching losses that start to play a role at low load: this curve in the FIG. 3 was extracted on an ideal setup with no switching losses. The disclosure can apply for a continuous switching mode (CCM) at high current, when the switching losses are negligible.

Figure 4:
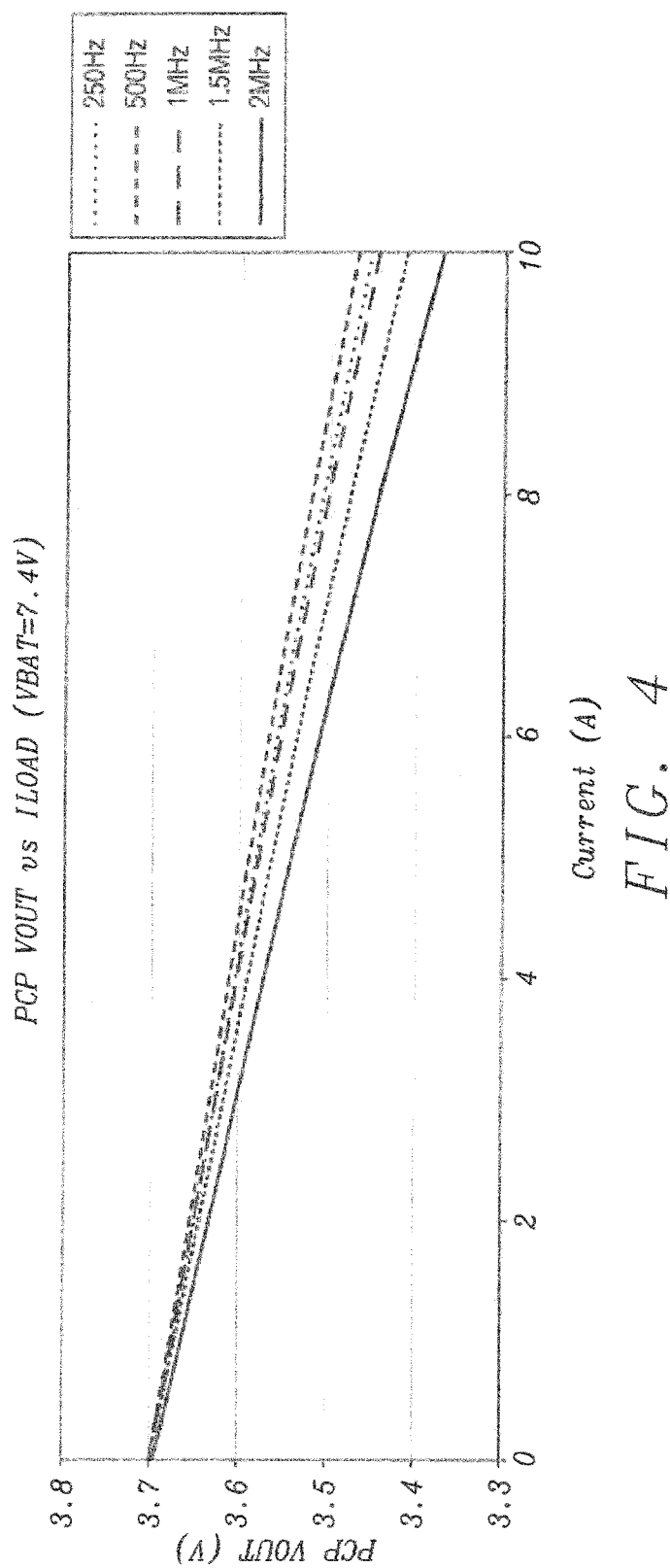
FIG. 4 illustrates variation of charge pump output voltage versus load current for different switching frequencies.
Figure 5:
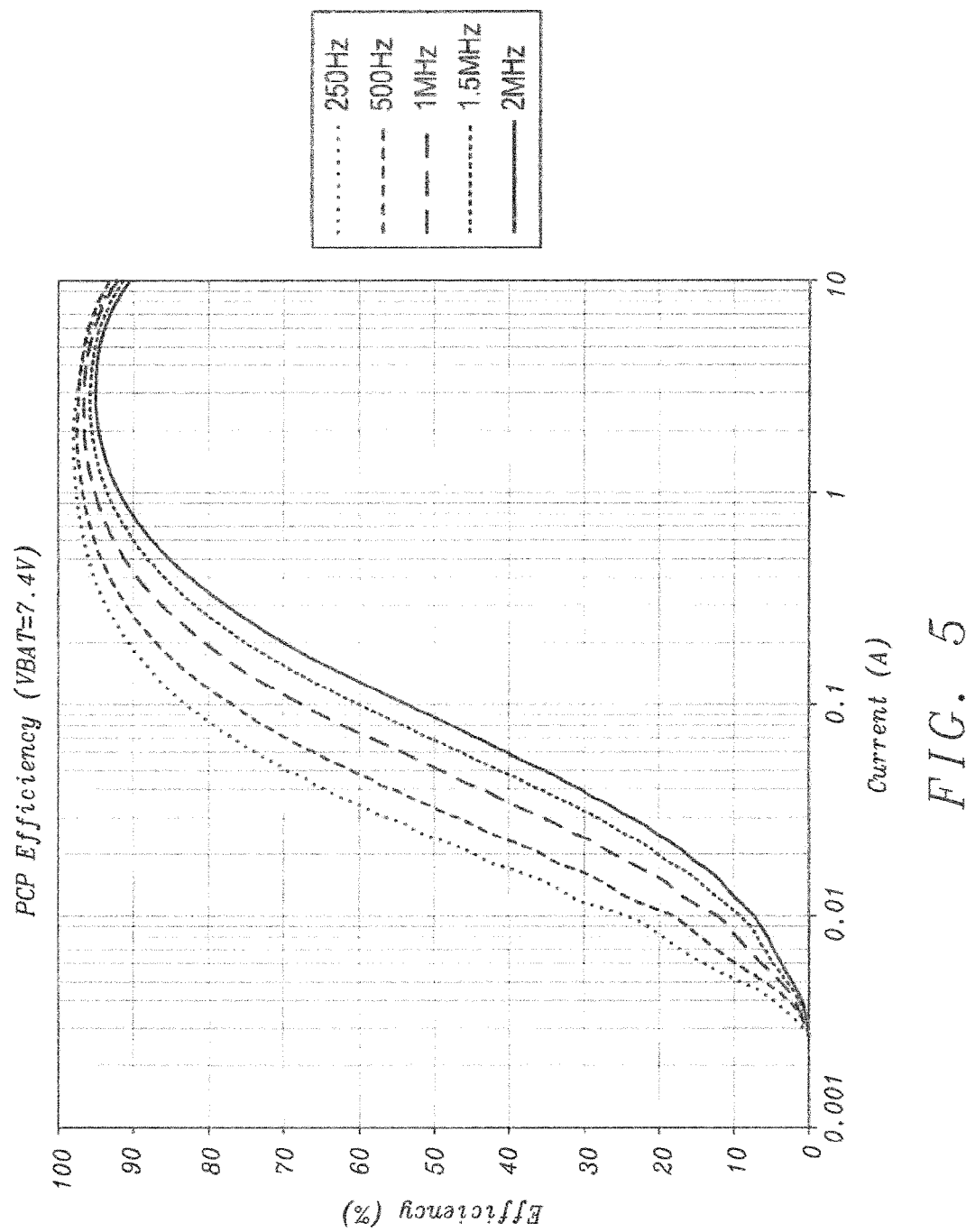
FIG. 5 illustrates charge pump efficiency versus load current for the same switching frequencies as in FIG. 4.

On silicon, the proof is also given for both RE and the RE-dependent efficiency, as seen in FIGS. 4 and 5.

FIG. 4 shows variation of VOUT (y-axis) versus load current (x-axis), for switching frequencies of 250 Hz, 500 Hz, 1 MHz, 1.5 MHz and 2 MHz. FIG. 5 shows efficiency (y-axis) versus load current (x-axis) for the same switching frequencies.

RE is reflected by the VOUT drop, and directly correlates to the efficiency when the load exceeds 2 A, so when the ohmic losses dominate. Also, we note that this optimum also depends on the load: it is 300 kHz at 10 A, and ~500 kHz at 5 A, then 300 kHz at 2 A. If other parameters (CF, CR) vary, this optimum changes again.

This frequency-optimum would not only require the knowledge of CF, CR, but also would vary with ILOAD. Also, CF and CR have nominal spread and are de-rated and this de-rated value can vary with the time: if VIN and VOUT vary, CF and CR vary too. Furthermore, RDSON also varies with VIN and with the die temperature, thus making the optimum value of RDSON variable too. This calls for 4-dimension look-up tables to adapt the frequency to these parameters to be able to maintain the optimal efficiency. Otherwise, in case the choice relies on one frequency, then between 1% and 3% of efficiency is lost (around 95% of this depending on the load in CCM), which corresponds to 20% to 50% more losses and more self-heating.

The disclosure provides for Maximum Efficiency Point Tracking (MEPT) of charge pump operation. It is very cheap and in a preferred embodiment tunes the frequency of the charge pump to track the best efficiency. It thus self-adapts to the varying parameters CF, CR, RDSON and ILOAD.

Figure 6:
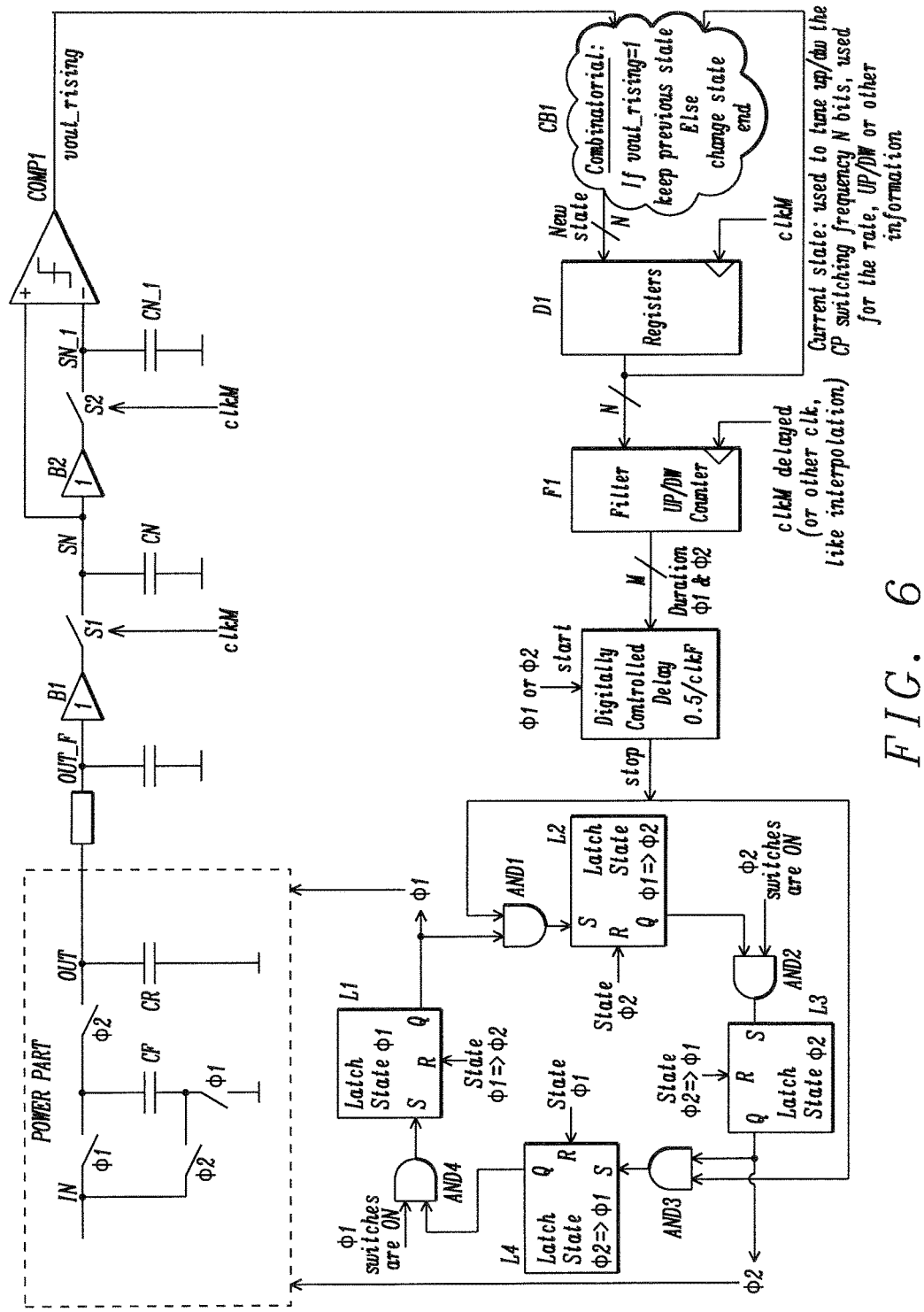
FIG. 6 illustrates a charge pump maximum efficiency point tracking system according to an embodiment of the disclosure.

One embodiment of a DC-DC voltage converted circuit according to the disclosure is shown in FIG. 6. The circuit comprises a charge pump, a measurement circuit such as a sample and hold device which is arranged to measure and store successive values of an output voltage of the charge pump, and logic circuit which compares the stored output voltage values and adjusts an operational parameter of the charge pump based on the comparison.

The charge pump of this embodiment comprises CF, CR and the four switches driven by ϕ1, ϕ2. This is for illustration only, and the charge pump can be of any kind including single, inter-leaved; multiplier, divider, fractional. All of them share the same effect of efficiency that decreases with VOUT, and that has an optimum (switching frequency) for a given set of other parameters {RDSON, CF, CR, ILOAD}.

The measurement circuit may comprise a sample and hold system, and in this embodiment a sample and hold system comprising switches and capacitors {S1, CN} and {S2, CN_1} is illustrated. It is to be appreciated that sample and hold systems of any kind may be provided. In a preferred embodiment, the measurement circuit operates at a slower frequency than the lower bound of a charge pump frequency operating range. In this embodiment, the sample and hold system operates with a slower clock clkM, with optional buffers B1, B2. For example, if we target a CP switching frequency tunable between 200 kHz and 2 MHz, then clkM can be 50 kHz. So everytime clkM is clocked, it shifts the sampled value of VOUT.

Note that VOUT can be filtered into OUT_F to remove the CP ripple. So the comparator COMP1 reflects whether VOUT, between two clkM events, has increased or decreased. Note also that any suitable circuit for measuring and holding successive VOUT values could be used, not just sample and hold (S&H) circuits. For example, a set of analog-to-digital converters and shift registers could be used; or any other equivalent or suitable alternative.

A logic circuit receives the output of the measurement circuit and adjusts an operational parameter of the charge pump based on the comparison.

The logic circuit may comprise a state machine, and in this illustrated embodiment a Moore state machine is provided comprising elements {D1, CB1}. Any other type of state machine or suitable equivalent can be used. It memorizes on N bits a current state, captures the COMP1 output and updates the state. Assuming the previous state was aimed at increasing VOUT (and thus the efficiency) and we get a decrease of VOUT, then the combinatorial part CB1 must adapt the state to try to re-increase VOUT.

One illustrative example is to tune up/down the frequency as follows:

If the previous state was to step up (increase) the frequency: then:
 If VOUT goes up: we can further increase the frequency; we are going to the right trend/direction.
 If VOUT goes down: we may have reached the optimum efficiency point, we change the state to decrease VOUT If the previous state was to step down (decrease) the frequency: then:

If VOUT goes up: we can further decrease the frequency

If VOUT goes down, we may have reached the optimum efficiency point, we change the state to increase VOUT In this embodiment the state is coded on 1 bit (frequency step up/down (dw)), but it is possible to encode the state on more than one bit in order to provide alternative or more sophisticated functionality. One could act on other parameters: splitting CF and the power switches into many elements, for example. This is another dimension and the {D1, CB1} state-machine can be refined accordingly.

The current state is applied to a digital filter that tunes in the time-domain the way the new state is applied to vary the frequency. This filter can work on any clock.

The digital filter output (M bit coding) may be used to tune the duration of a delay used for the phase of the CP. Note that only two phases are shown in this figure, and also the digital filter output is applied on a delay. More phases can be used, and the digital filter output can be applied differently. For example, to tune the frequency; the M bits can be applied onto a VCO/DCO.

That way, the loop is closed: the state-machine chooses an initial direction (example: to increase the frequency), looks at the results (VOUT variation) and maintains its decision or changes its mind depending on the result. Eventually, the state toggles around an optimum (maximum for VOUT) that corresponds to the best configuration for a maximum frequency.

Figure 9:
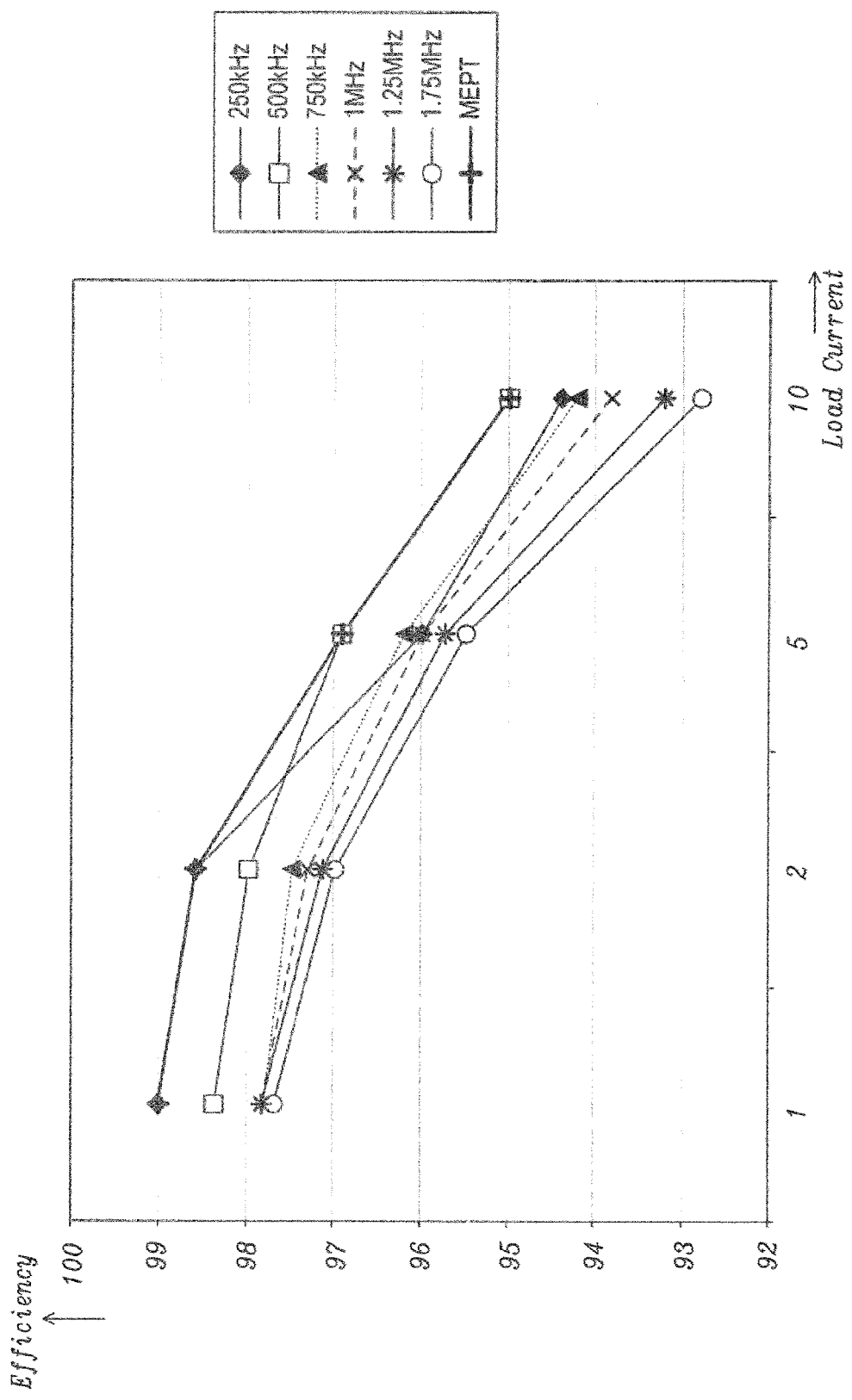
FIG. 9 illustrates efficiency versus load current a maximum efficiency point tracking system according to the disclosure as compared with various non-frequency compensated operations.

Variable frequency systems are acceptable in the portable market where RF is involved, thanks to EMI-shielding. The present disclosure provides digital components which minimize the design/layout effort, and the efficiency tracking reduces losses by 20% to 50% compared with non-frequency compensated operation; as shown in FIG. 9, which shows final efficiency (y-axis) is plotted versus the load current (x-axis) for the maximum efficiency point tracking (MEPT) according to the disclosure as compared with various non-frequency compensated operations.

Figure 7:
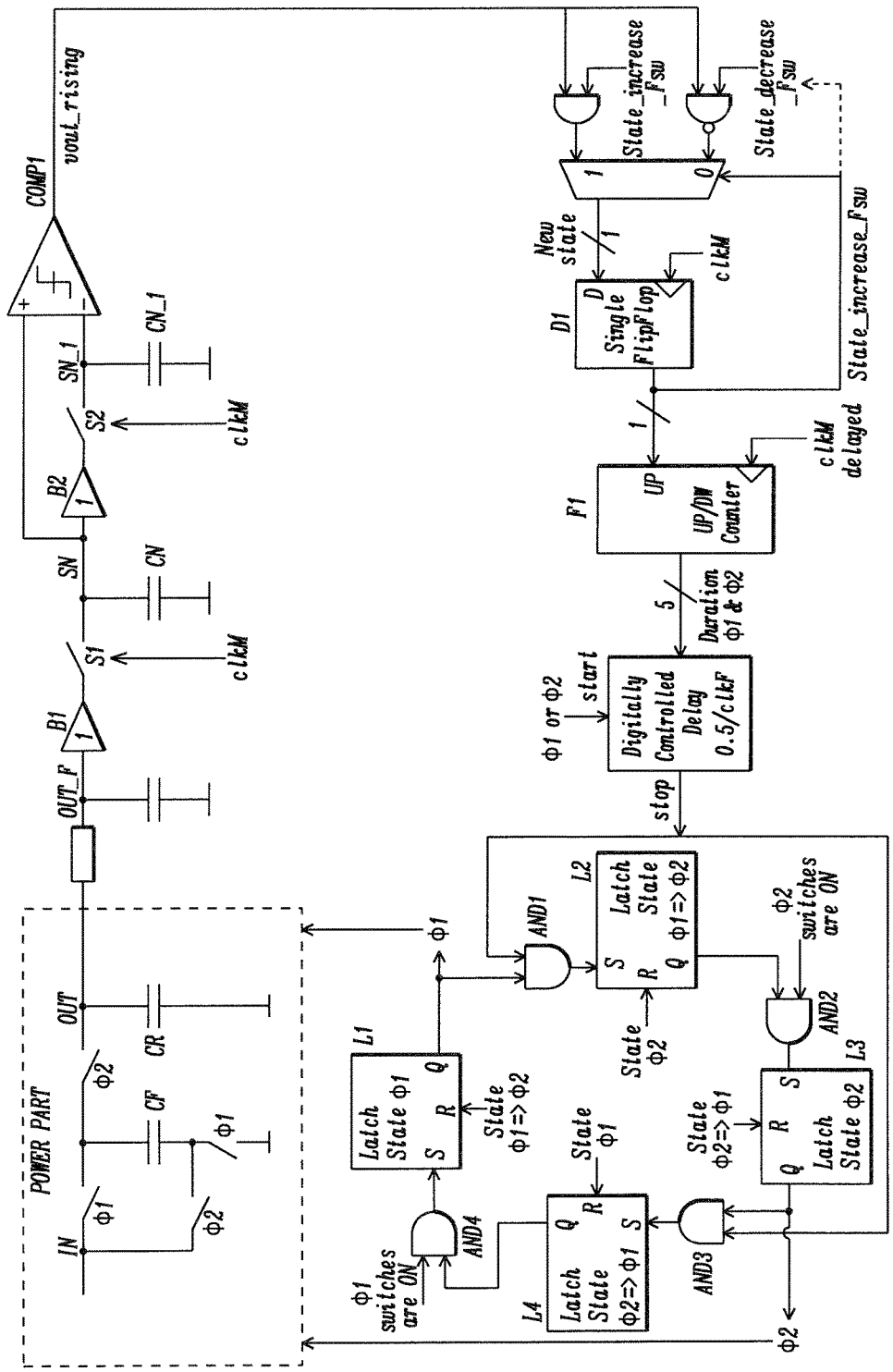
FIG. 7 illustrates a charge pump maximum efficiency point tracking system according to another embodiment.

FIG. 7 shows an example basic implementation, applicable to frequency tuning. As with FIG. 6, the state-machine is reduced to one flip-flop D1 (to code the state increasing/decreasing the charge-pump frequency). The digital filter can thus be a simple UP/DOWN (UP/DW) counter. So assuming we were increasing the frequency, and we now detect VOUT went down during the last clkM cycle:

1. The state is updated to decrease the frequency, thus applying "0" on the UP-input of the counter.
2. The counter decreases its 5-bit output. The delay is increased in this case, because the counter decreases the value of a current injected into a capacitor for implementing the delay.
3. So, the phase duration is increased and the CP oscillates slower, thus inverting the trend and bringing back up VOUT.

Figure 8:
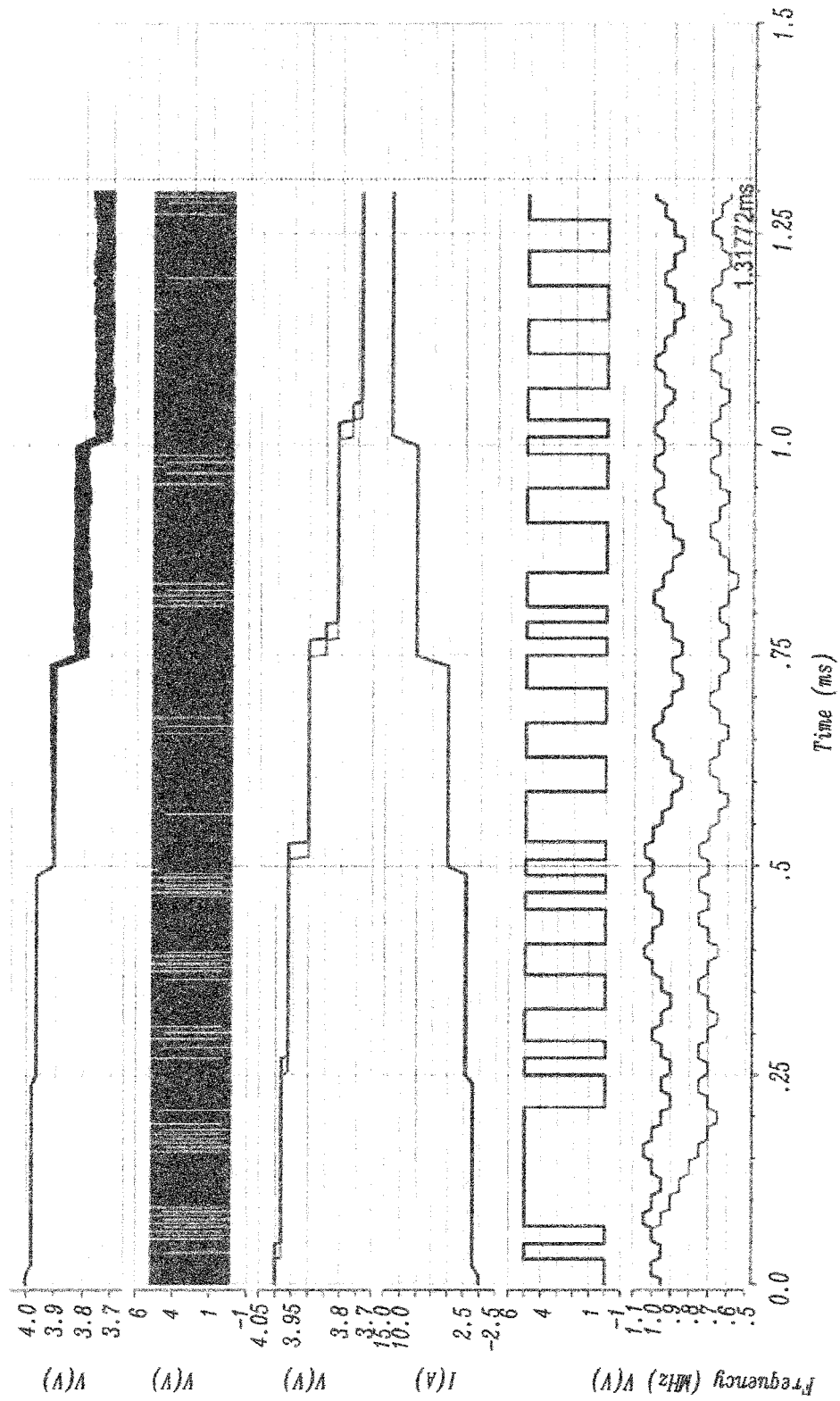
FIG. 8 illustrates performance of the system of FIG. 7 under varying load.

This system was implemented on an inter-leaved charge-pump divider. The results are plotted in FIG. 8 for two values of CF (10 uF and 20 uF) and when the load is varied.

The lowest strip is the real time CP switching frequency.

It is toggling around its optimum, which is ~900 kHz (CF=10 uF) and ~650 kHz (CF=20 uF).

When ILOAD varies, the average value (visible for the case 20 uF) varies to always maximize VOUT. It is ~700 kHz at 2 A, then ~600 kHz at 5 A, then back to ~700 kHz at 10 A for this special implementation.

The toggling of the frequency is a 2LSBs-ripple: indeed, when the system detects VOUT inverts its trend, it reverts the LSB (add/subtract). But then it needs to keep this state another time to check if there is a chance it needs to keep proceeding in this direction.

The simulation results are recorded and the final efficiency is plotted versus the load current, in FIG. 9.

Various improvements and modifications can be made to the above without departing from the scope of the disclosure.

Glossary

CP charge pump
CF flying capacitor (also used to represent the capacitance of the flying capacitor)
CR reservoir capacitor (also used to represent the capacitance of the reservoir capacitor)
CCM continuous conduction mode
VIN input voltage (of the charge pump)
VOUT output voltage (of the charge pump)
$\phi$1 charge pump phase 1
$\phi$2 charge pump phase 2
EFF efficiency
POUT output power (of the charge pump)
PIN input power (of the charge pump)
ILOAD current of output load
Pswitching switching power losses
Pesr equivalent series resistance power losses
RE equivalent resistance
FSW charge pump switching frequency
RDSON resistance from drain to source in the on state
Tdead (duration of) charge pump dead time
VCO voltage controlled oscillator
DCO digitally controlled oscillator
RF radiofrequency
EMI electromagnetic interference

What is claimed is:

1. A method of optimizing an efficiency of a charge pump during a charge pumping operation comprising:
measuring at a first time a first output voltage of a charge pump;
storing said first measured voltage;
measuring at a second later time a second output voltage of said charge pump; comparing said second measured voltage with said first measured voltage; and adjusting one or more parameter(s) of the charge pump operation based on said comparison, in order to optimize its efficiency.

2. The method of claim 1, wherein the parameter of the charge pump operation is a switching frequency of the charge pump.

3. The method of claim 1, wherein adjusting a parameter of the charge pump operation comprises selectively connecting a chosen number of flying capacitors.

4. The method of claim 1, wherein the charge pump is of a type comprising a plurality of energy storage elements and switches arranged to selectively apply voltages to the energy storage elements in a charging phase and a discharging phase.

5. The method of claim 1, wherein measuring and comparing said successive first and second output voltages of said charge pump comprises sampling and holding a first output voltage value; sampling and holding a second output voltage value; and comparing the held output voltage values.

6. The method of claim 1, wherein at least one of said one or more parameter(s) of the charge pump operation is adjusted in a first direction if the output voltage is determined to be increasing and a second direction if the output voltage is determined to be decreasing.

7. A DC-DC voltage converter circuit comprising:
a charge pump;
a measurement circuit adapted to:
   measure at a first time an output voltage of the charge pump;
   store said first measured voltage:
   measure and store at a second later time a second output voltage of said charge pump;
   compare said stored second measured voltage with said stored first measured voltage; and
a logic circuit arranged to cooperate with the measurement circuit to optimize a charge pump efficiency during a charge pumping operation, by adjusting an operational parameter of the charge pump based on the comparison.

8. The DC-DC voltage converter circuit of claim 7, wherein the measurement circuit comprises a sample and hold circuit.

9. The DC-DC voltage converter circuit of claim 7, wherein the measurement circuit comprises a shift register.

10. The DC-DC voltage converter circuit of claim 7, wherein the output of the logic circuit is used to tune the duration of a delay used for a charging or discharging phase of the charge pump.

11. The DC-DC voltage converter circuit of claim 7, wherein the logic circuit comprises a state machine.

* * * * *